United States Patent
Leighton et al.

(10) Patent No.: US 10,629,515 B2
(45) Date of Patent: Apr. 21, 2020

(54) SYSTEM AND METHOD FOR COOLING DIGITAL MIRROR DEVICES

(71) Applicant: Xerox Corporation, Norwalk, CT (US)

(72) Inventors: Roger G. Leighton, Hilton, NY (US); Mark A. Adiletta, Fairport, NY (US); Christopher D. Atwood, Rochester, NY (US); Ali R. Dergham, Fairport, NY (US); Francisco Zirilli, Fairport, NY (US); Gary D. Redding, Victor, NY (US); Peter J. Nystrom, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 247 days.

(21) Appl. No.: 15/384,411

(22) Filed: Dec. 20, 2016

(65) Prior Publication Data
US 2018/0177076 A1 Jun. 21, 2018

(51) Int. Cl.
*H05K 7/20* (2006.01)
*H01L 23/473* (2006.01)
*G02B 26/08* (2006.01)
*G02B 7/18* (2006.01)

(52) U.S. Cl.
CPC ......... *H01L 23/473* (2013.01); *G02B 7/1815* (2013.01); *G02B 26/0833* (2013.01)

(58) Field of Classification Search
CPC ......... H05K 7/20263; H05K 7/20145; H05K 7/20154; H05K 7/202; H05K 7/20272
See application file for complete search history.

(56) References Cited

U.S. PATENT DOCUMENTS

| | | | | |
|---|---|---|---|---|
| 4,748,495 A | * | 5/1988 | Kucharek | H01L 23/4338 174/16.3 |
| 5,490,009 A | * | 2/1996 | Venkateswar | G02B 26/0841 348/755 |
| 5,940,271 A | | 8/1999 | Mertol | |
| 6,345,507 B1 | * | 2/2002 | Gillen | F25B 21/04 136/203 |
| 6,545,352 B1 | | 4/2003 | Ruckdeschel | |
| 6,814,445 B2 | | 11/2004 | Kalyandurg et al. | |
| 6,816,375 B2 | | 11/2004 | Kalyandurg | |
| 7,072,184 B2 | | 7/2006 | Kalyandurg | |
| 7,515,367 B2 | * | 4/2009 | Hewlett | G02B 26/0833 345/473 |
| 7,660,124 B2 | | 2/2010 | Chen et al. | |
| 9,036,244 B2 | * | 5/2015 | Maxik | G02B 26/0833 359/291 |
| 2001/0041381 A1 | * | 11/2001 | Choi | G02B 26/0841 438/106 |

(Continued)

OTHER PUBLICATIONS

U.S. Appl. No. 15/270,607, filed Sep. 20, 2016, Hunter.

*Primary Examiner* — Jayprakash N Gandhi
*Assistant Examiner* — Michael A Matey
(74) *Attorney, Agent, or Firm* — Ortiz & Lopez, PLLC; Kermit D. Lopez; Luis M. Ortiz

(57) ABSTRACT

A cooling system comprising of a coolant manifold, a heat sink configured to fit in the coolant manifold, a plurality of cooling fins formed in the heat sink, and a coolant configured to flow through the coolant manifold to the heat sink. Diamond shaped pin fins associated with the heat sink create a series of divergent fluid paths for the cooling fluid that helps to create turbulence and improved heat transfer.

20 Claims, 7 Drawing Sheets

(56) References Cited

U.S. PATENT DOCUMENTS

| | | | |
|---|---|---|---|
| 2005/0126184 A1* | 6/2005 | Cauchy | F25B 21/02 62/3.3 |
| 2005/0151244 A1* | 7/2005 | Chrysler | H01L 23/473 257/713 |
| 2005/0265001 A1* | 12/2005 | Saito | H01L 23/4006 361/710 |
| 2007/0020107 A1* | 1/2007 | Sauciuc | F04C 13/005 417/16 |
| 2008/0237847 A1* | 10/2008 | Nakanishi | H01L 23/473 257/722 |
| 2010/0277868 A1* | 11/2010 | Beaupre | H01L 23/473 361/700 |
| 2010/0328619 A1* | 12/2010 | Harland | G03B 21/16 353/54 |
| 2012/0152498 A1* | 6/2012 | Lyon | F28D 15/00 165/104.31 |
| 2013/0050669 A1 | 2/2013 | Maeda | |
| 2013/0188229 A1* | 7/2013 | Paul | B41J 2/465 358/475 |
| 2014/0000851 A1* | 1/2014 | Wang | F28D 15/02 165/104.26 |
| 2014/0254098 A1* | 9/2014 | Arvelo | H01L 23/34 361/699 |
| 2015/0377446 A1* | 12/2015 | Bhakta | G02B 26/0833 362/510 |
| 2016/0129792 A1* | 5/2016 | Gohara | H01L 23/473 310/54 |
| 2016/0154294 A1* | 6/2016 | Fujioka | H04N 9/3188 353/87 |
| 2016/0242313 A1* | 8/2016 | Singh | H05K 1/184 |
| 2016/0277716 A1* | 9/2016 | Mikawa | G02B 26/0833 |
| 2017/0187996 A1* | 6/2017 | Yokoyama | H04N 9/3144 |
| 2017/0223869 A1* | 8/2017 | Shibasaki | H01L 23/473 |
| 2017/0271240 A1* | 9/2017 | Inoue | H01L 25/18 |
| 2018/0172296 A1* | 6/2018 | Buff | F24F 13/22 |

* cited by examiner

SYSTEM AND METHOD FOR COOLING DIGITAL MIRROR DEVICES

TECHNICAL FIELD

Embodiments are generally related to the field of printing. Embodiments are also related to methods and systems to prevent overheating. Embodiments are further related to conducting heat away from processing elements. Embodiments are further related to digital mirror devices.

BACKGROUND

Certain print systems may suffer from issues associated with overheating. For example, systems that use digital mirror devices (DMDs) require dissipation of heat. Specifically, the silicon substrate on which a DMD is constructed must provide means for heat removal from the DMD substrate.

Certain DMD surfaces may require maintenance of a surface temperature of 55 degrees Celsius. The cooling area is small but must be able to account for waste energy absorbed by the DMD that results from the incident 320 watts or more of incident laser energy. In prior art systems, the DMD chip was designed for 60 watt visible band emission, but the printing system program may be using 360 watts at 550 nm.

Accordingly, there is a need in the art for systems and methods that allow direct heat removal from a DMD substrate.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for heat removal.

It is another aspect of the disclosed embodiments to provide a method and system for heat removal from printing systems.

It is yet another aspect of the disclosed embodiments to provide an enhanced method and system for heat removal from DMD devices associated with printing systems.

The aforementioned aspects and other objectives and advantages can now be achieved as described herein. A method and system for cooling a chip comprises a coolant manifold, a heat sink configured to fit in the coolant manifold, a plurality of cooling fins formed in the heat sink, and a coolant configured to flow through the coolant manifold to the heat sink. The system can further comprise a thermal grease configured on a heating block associated with the coolant manifold. The cooling fins comprise at least one of diamond shaped cooling fins, tubular shaped cooling fins, and micro pillars. In an embodiment, the coolant further comprises of non-conductive coolant.

In an embodiment, the system further comprises an inlet valve for introducing the coolant into the coolant manifold and an outlet valve for allowing coolant to exit the coolant manifold wherein the coolant is circulated through the coolant manifold. The system can further comprise a chip housing in thermal contact with the heat sink. The system may also comprise a closed cell foam surrounding the heat sink, configured to prevent condensation on the heat sink.

BRIEF DESCRIPTION OF THE FIGURES

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The particular values and configurations discussed in the following non-limiting examples can be varied and are cited merely to illustrate one or more embodiments and are not intended to limit the scope thereof.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one embodiment, a printing technology is disclosed. The embodiment uses thermochromic ink which can permanently change state as the amount of energy deposited on the media increases. The marking subsystem can use a combination of high power Laser Diode Arrays (LDAs) in conjunction with Digital micromirror devices (DMD) or arrays to direct energy onto media. The marking system can adjust the energy levels incident on the media to provide a desired energy at the media surface. One problem with such a printing system arises because the DMD chip can quickly overheat from the incident laser energy.

Figure 1:
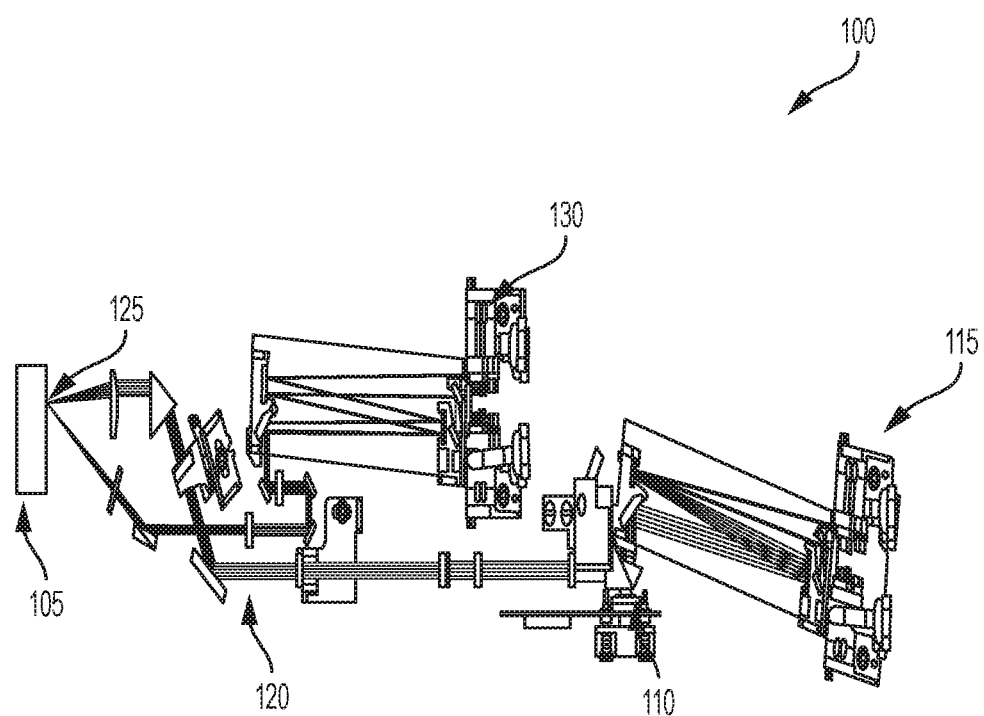
FIG. 1 depicts a block diagram of a printing system which is implemented in accordance with the disclosed embodiments.

FIG. 1 illustrates a high-level block diagram of the major components in a printing system 100 in accordance with one embodiment. The media 105 can comprise a blank thermochromic ink on its exterior surface. A DMD mirror array 110 can direct light from the imaging LDA 115 to an imaging path 120, and eventually onto the media 105 at the image plane 125.

A preheating LDA subsystem comprising preheating LDA 130 can direct energy to the media 105 which can bring the thermochromic ink to a temperature point just below the point at which the thermochromic ink will begin to expose and reveal visible marking.

The laser light provided from the imaging LDA 115 on the DMD mirror array 110 causes extreme temperature increases. The embodiments disclosed herein provide a highly conductive thermal and non-conductive electrical grease and diamond pin fin arrangement to conduct heat away from the DMD chip more efficiently.

Figure 2:
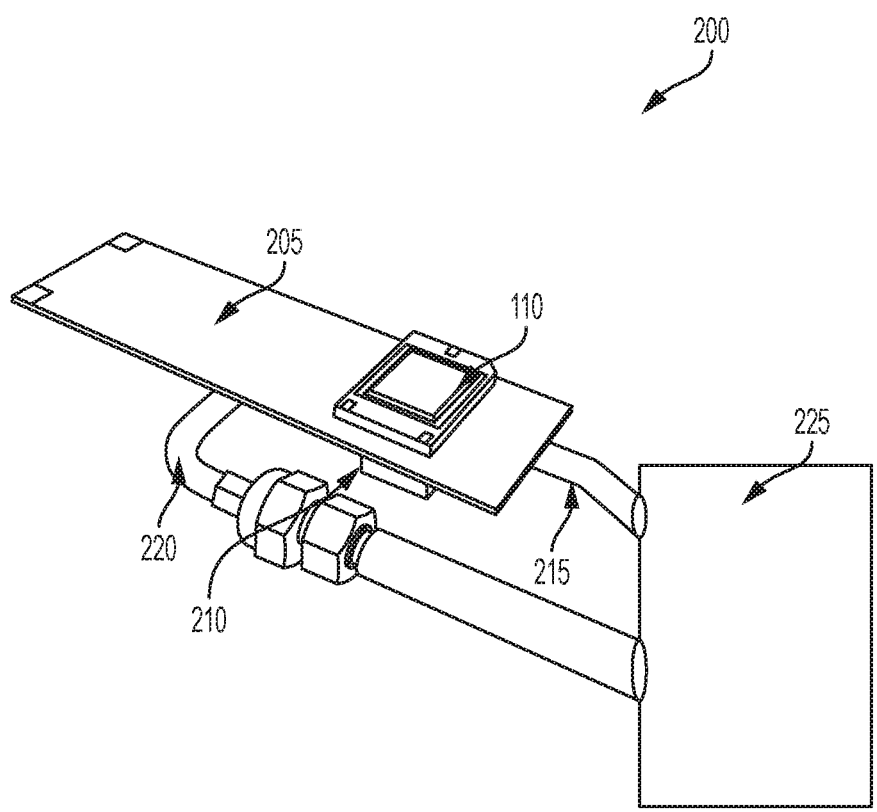
FIG. 2 depicts a cooling system in which aspects of the present embodiments may be implemented.

FIG. 2 illustrates a block diagram of a cooling system 200 associated with the DMD mirror array 110. The movement of the mirrors in the DMD mirror array 110 is generally controlled electronically with a computer and/or circuitry provided on a PCB 205. The DMD is thus mounted on the board 205. A cooling block 210 can be disposed below the board 205. The cooling block 210 is serviced with cooling fluid via cooling circulation system 225 which provides coolant to the cooling block 210 via cooling flow input 215 and cooling flow output 220. The cooling circulation system may include any number of subsystems including pumps, heat pumps, refrigerants, etc., necessary to cool and circulate the coolant In an embodiment, the cooling circulation system 225 can pump the cooling fluid through the cooling block with a velocity of 3.6 m/s, using the FC-72 non-electrically conductive fluid. It should be appreciated that the fluid can be a two phase refrigerant, but may only be used as a single phase fluid at 4.4 Celsius.

Figure 3:
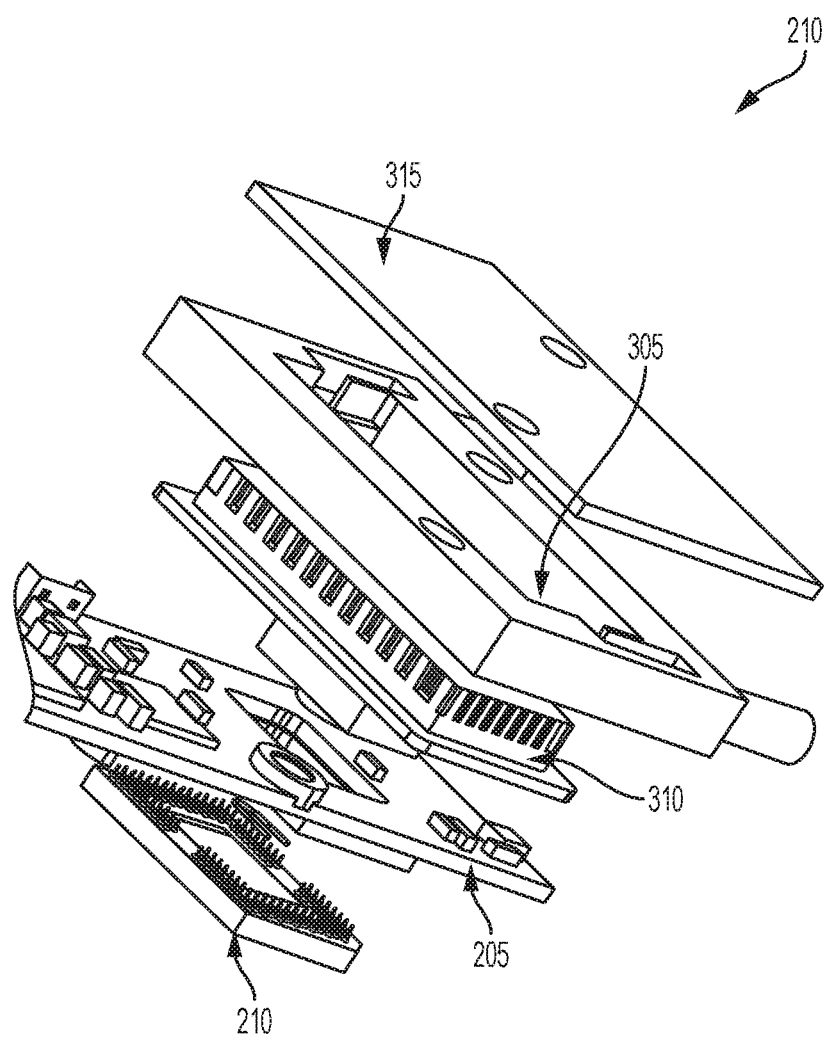
FIG. 3 depicts a diagram of a cooling block, in accordance with an exemplary embodiment.

FIG. 3 illustrates a diagram of the cooling block 210 in accordance with an embodiment. The cooling block 210 includes a cooling manifold 305 which can be mounted to PCB 205. The cooling manifold 305 may preferably be formed of copper, but other similar conducting materials may alternatively be used. The cooling manifold 305 is generally formed to accept a heat sink 310. Heat sink 310 may also be formed of copper or other such conducting material and can be soldered to cooling manifold 305. The cooling manifold includes a cover 315 also formed of copper or other such material.

Cooling fluid is pumped into the cooling manifold 305 via the cooling circulation system 225 and is introduced to the heat sink 310. The heat sink 310 is specifically configured with one or more cooling fins as illustrated in greater detail in FIGS. 5 and 6. The heat sink 310 is in thermal communication with the DMD 110 via a pillar (detailed in FIG. 5). As the incident energy from the LDA increases the temperature of the DMD 110, the heat is conducted away from the DMD 110 through the heat sink 310. The heat is thus transferred to the cooling fluid via the heat sink 310 and then expelled as the cooling fluid exits the cooling manifold 305.

The cooling fluid can be a refrigerant single phase electrically non-conductive fluid. This is preferable in order to prevent shorting of the DMD to ground via a fluid path. The fluid prevents conductive grounding of the DMD surface which has ground potential. In certain embodiments, the cooling fluid can be thermal fluid FC-72 from 3M which is non-conductive at 1e15 ohm sq. The entire fluid path has to be electrically insulated from ground to prevent any continuity between the conducting joints.

Figure 4:
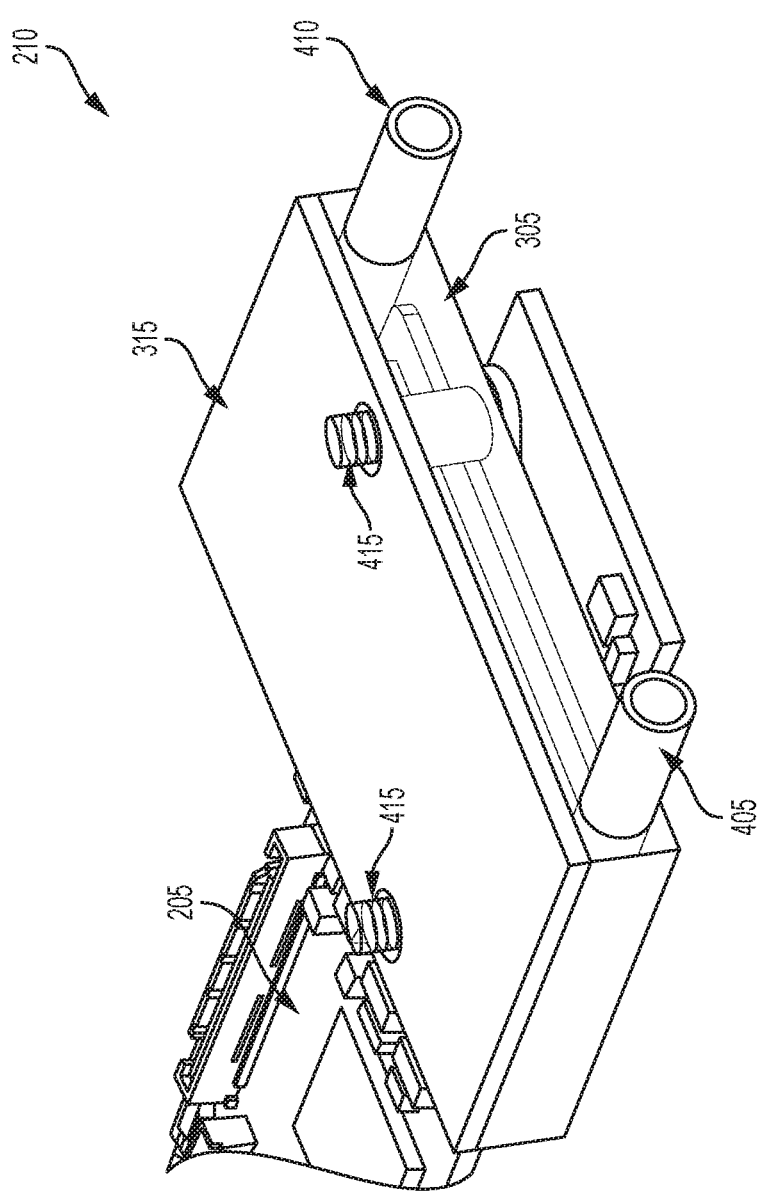
FIG. 4 depicts a diagram of an alternative embodiment of a cooling block in accordance with the disclosed embodiments.

FIG. 4 illustrates an alternative diagram of the cooling block 210 in accordance with another embodiment. The cooling manifold 305 includes a flow inlet 405 and flow outlet 410. In addition, the cooling manifold can be capped with cover 315.

The cover 315 can be soldered or otherwise mechanically connected to the manifold housing. The springs 415 with plastic bushings (not shown) provide a bias to hold the entire assembly against the DMD and in place. The entire heat sink is also spring loaded by springs 415 to provide good thermal connection to the DMD 110 surface via thermal grease applied to the interface between the pillar and DMD. A preferable thermal grease thickness is 12 um (other grease thicknesses are possible).

A series of plastic bushings (not shown) isolate the spring load from ground to prevent shorting. The spring 415 loads the cooling block 315 and provides the force required to datum the DMD chip 110 into 3 datum pads on the front side of the DMD and to squeeze the air out between the thermal interface and associated thermal grease. The spring load can also overcome strain forces.

Figure 5:
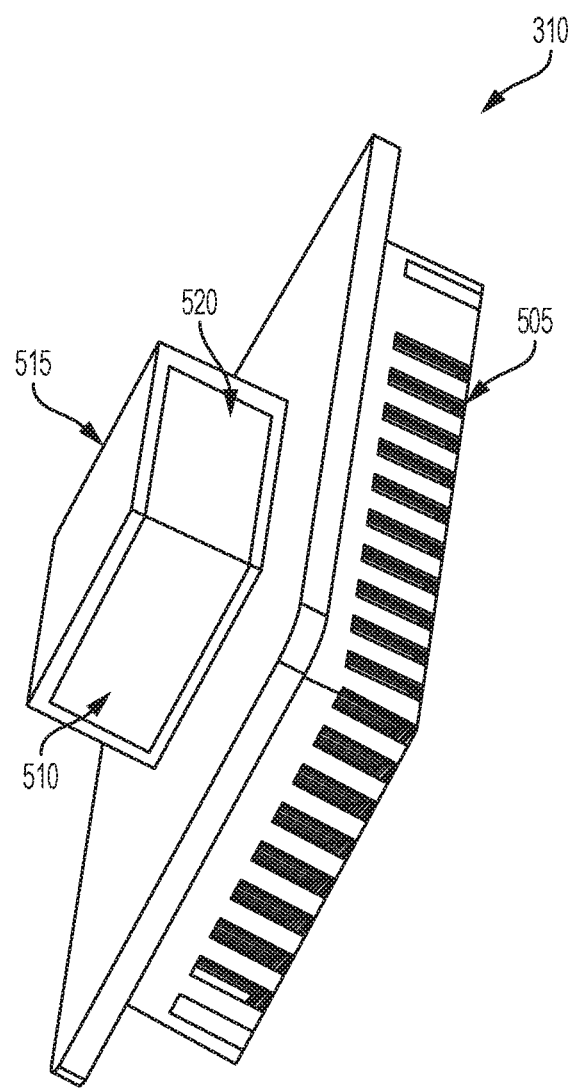
FIG. 5 depicts a diagram of a heat sink, in accordance with an embodiment.

FIG. 5 illustrates a detailed diagram of a heat sink 310. The heat sink 310 includes a pillar 510 which serves as a heat conducting medium between the DMD 110 and one or more heat conducting fins 505. A thermal grease 515 can be disposed on the top of the pillar 510.

In certain embodiments, the thermal grease 515 comprises a thin thermal grease layer that is 5 um to 12 um thick. The thermal grease reduces the thermal resistance between the pillar 510 and the DMD 110 surface. In certain embodiments, the thermal grease 515 may be Artic Silver grease which is non-conductive. A small gap can allow sufficient contact between the heat sink and chip interface. The heat sink 310 may also include a closed cell foam 520. The closed cell foam 520 can surround the heat sink 310 and serves to prevent condensation in or around the heat sink and DMD 110.

In general, the more fins configured in association with the heat sink 310, the more efficiently the heat from the DMD chip 110 can be transferred away from the DMD chip 110. In an embodiment, the heat sink 310 includes 96 pin fins 505, with each pin fin 505 shaped in a diamond pattern. The pin fins 505 can be interleaved to enhance fluid distribution and turbulence. The pins 505 can serve to remove 17.6 w/cm^2 and maintain the surface temperature of the DMD 110 at 55 Celsius or below. The pins 505 can be machined directly in copper using a slitting saw with 30 degree diagonal cuts. The pins arranged in this manner are 96% efficient with 3.6 kmm^2 wetted area.

Figure 6:
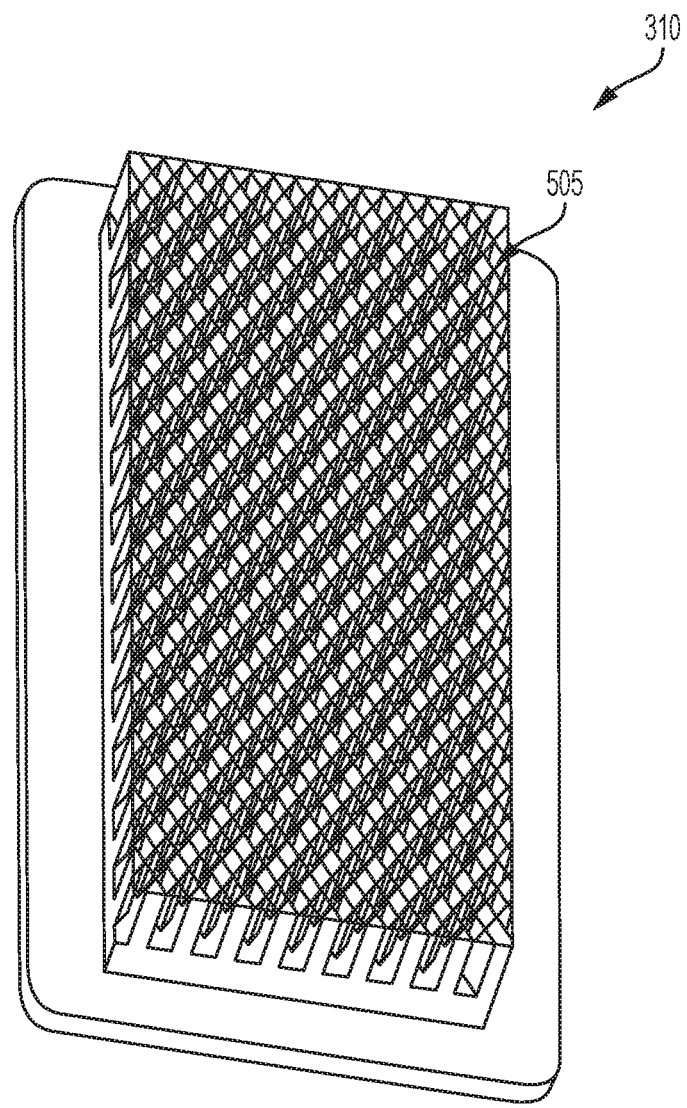
FIG. 6 depicts another view of a diagram of a heat sink, in accordance with an embodiment.

FIG. 6 illustrates an embodiment of the fins 505 configured in a diamond shape. The diamond shaped pin fins 505 create a series of divergent fluid paths for the cooling fluid that helps to create turbulence and improved heat transfer from the DMD 110 to the cooling fluid via the pin fins 505. In other embodiments, the pins 505 may be shaped in other ways according to design considerations. For example, teardrop shaped pin fins may be used in order to reduce friction losses. In other embodiments, the pin fins 505 may be tubular shaped cooling fins or micro pillars.

Figure 7:
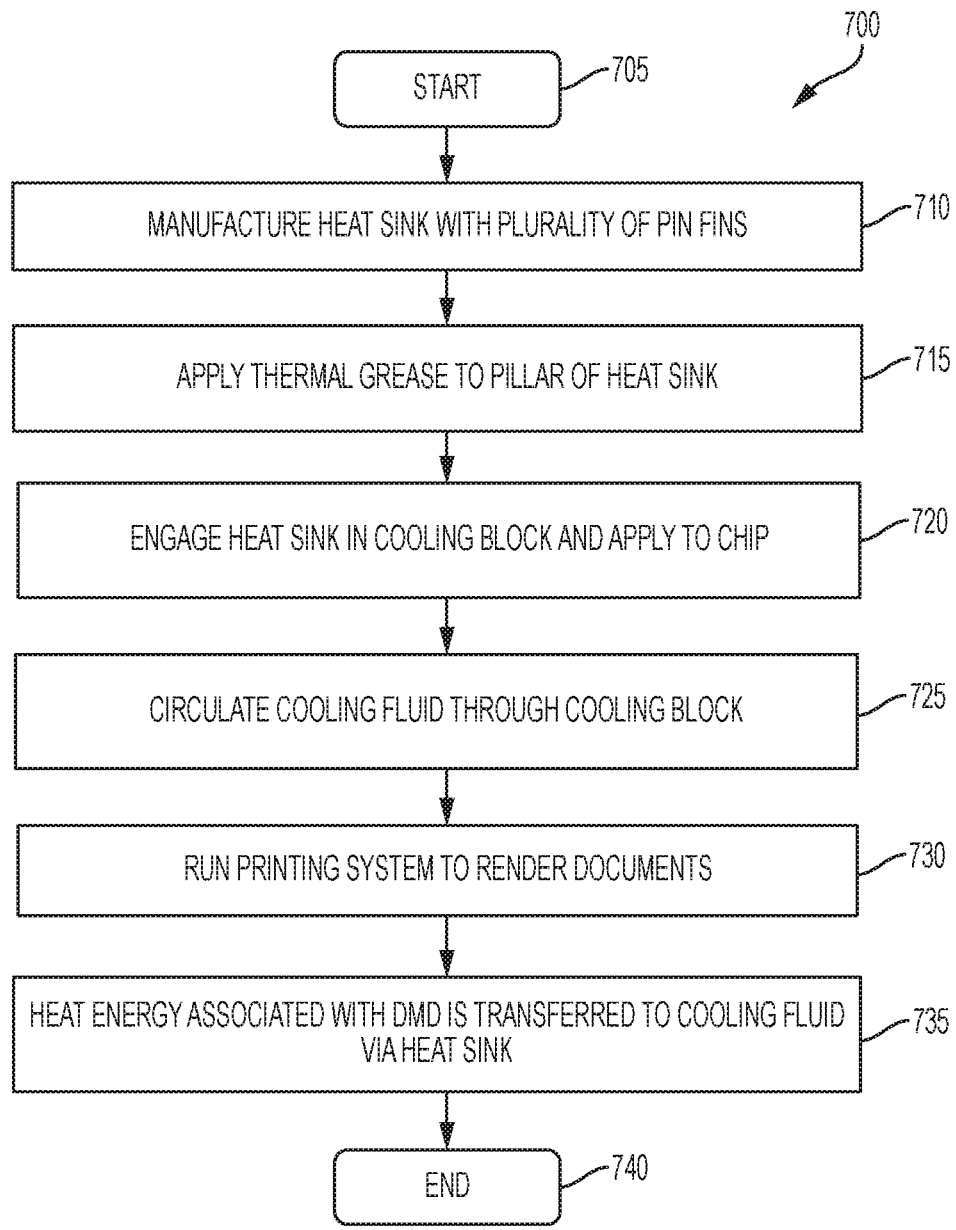
FIG. 7 depicts a flow chart illustrating steps associated with a method for cooling a chip in accordance with the disclosed embodiments.

FIG. 7 illustrates a flow chart 700 of steps associated with a method for controlling the temperature of a chip. The method begins at step 705. At step 710, a heat sink and cooling block can be manufactured. Preferably this includes machining pins directly in copper using a slitting saw with 30 deg diagonal cuts to form a heat sink. At step 715, thermal grease can be applied to the pillar of heat sink.

The heat sink is ready for deployment. At step 720, the heat sink can be engaged in the cooling block and attached to a cooling circulation system. The heat sink is further connected to a chip, such as a DMD chip, with the thermal grease serving as the interface between the heat sink and chip. The cooling circulation system can then be used to circulate cooling fluid through the cooling block as shown at step 725.

The printing system associated with the DMD chip may now be engaged to render printed media as illustrated at step 730. The heat energy associated with the incident light from the LDA is transferred from the heat sink to the cooling fluid via the diamond shaped pins associated with the heat sink as shown at step 735. This allows for the uninterrupted use of the printing system without overheating the DMD chip. The method ends at step 740.

The embodiments disclosed herein can reduce the thermal resistance by a factor of six verses the use of a thicker 0.835 mm non-conductive indium/aluminum nitrate/indium laminate.

Based on the foregoing, it can be appreciated that a number of embodiments, preferred and alternative, are disclosed herein. For example, in one embodiment, a cooling system comprises a coolant manifold, a heat sink configured to fit in the coolant manifold, a plurality of cooling fins formed in the heat sink, and a coolant configured to flow through the coolant manifold to the heat sink. The system can further comprise a thermal grease configured on a heating block associated with the coolant manifold.

In an embodiment, the cooling fins comprise at least one of diamond shaped cooling fins, tubular shaped cooling fins, and micro pillars. In an embodiment, the coolant further comprises of non-conductive coolant.

In an embodiment, the system further comprises an inlet valve for introducing the coolant into the coolant manifold and an outlet valve for allowing coolant to exit the coolant manifold wherein the coolant is circulated through the coolant manifold.

In another embodiment, the system comprises a chip housing in thermal contact with the heat sink. The system may also comprise a closed cell foam surrounding the heat sink, configured to prevent condensation on the heat sink.

In another embodiment, a cooling apparatus comprises a coolant manifold, a heat sink configured to fit in the coolant manifold, a plurality of cooling fins formed in the heat sink, and a coolant configured to flow through the coolant manifold to the heat sink. In an embodiment, the apparatus can comprise a thermal grease configured on a heating block associated with the coolant manifold.

In an embodiment, the cooling fins comprise at least one of diamond shaped cooling fins, tubular shaped cooling fins, and micro pillars.

In an embodiment, the coolant further comprises of non-conductive coolant.

In another embodiment, the apparatus can further comprise an inlet valve for introducing the coolant into the coolant manifold and an outlet valve for allowing coolant to exit the coolant manifold wherein the coolant is circulated through the coolant manifold.

In another embodiment, the apparatus comprises a chip housing in thermal contact with the heat sink. The apparatus can also comprise closed cell foam surrounding the heat sink configured to prevent condensation on the heat sink.

In yet another embodiment, a cooling method comprises forming a heat sink in a coolant manifold, distributing a plurality of cooling fins in the heat sink, and circulating a coolant through the coolant manifold to the heat sink. The method can further comprise applying a thermal grease on a heating block associated with the coolant manifold.

In an embodiment, the cooling fins comprise at least one of diamond shaped cooling fins, tubular shaped cooling fins, and micro pillars. In an embodiment, the coolant further comprises of non-conductive coolant.

In yet another embodiment, the method further comprises configuring a chip housing in thermal contact with the heat sink. The method can include surrounding the heat sink with closed cell foam configured to prevent condensation on the heat sink.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A cooling system for a digital micromirror device, said cooling system comprising:
    a digital micromirror device comprising a digital micromirror array that directs light form an imaging laser diode array to an imaging path and onto media at an image plane;
    a coolant manifold configured to accept a heat sink in thermal communication with said digital micromirror device, wherein said heat sink is configured to fit in said coolant manifold and wherein said heat sink is spring loaded by a plurality of springs that provide for a spring load that facilitates a thermal connection to a surface of the digital micromirror device and wherein as an incident energy from said imaging laser diode array increases a temperature of said digital micromirror device, heat is conducted away from said digital micromirror device through said heat sink;
    a series of bushings that isolate said spring load from a ground to prevent electrical shorting, and wherein said spring load overcomes strain forces;
    a plurality of fins and at least one pillar formed in said heat sink, wherein said at least one pillar serves as a heat conducting medium between said digital micromirror device and at least one fin among said plurality of fins; and
    a coolant configured to flow through said coolant manifold to said heat sink.

2. The system of claim 1 further comprising: a thermal grease configured on a heating block associated with said coolant manifold and comprising a thin thermal grease layer in a range of 5 um to 12 um thick, wherein said thermal grease is applied to an interface between said at least one pillar and said digital micromirror device to facilitate said thermal connection to said surface of said digital micromirror device, and wherein said thermal grease comprises a non-conductive thermal grease.

3. The system of claim 1 wherein:
at least one fin among said plurality of fins comprises at least one of:
a pin fin shaped in a diamond pattern that facilitates a series of divergent fluid paths for said coolant;
a tubular shaped cooling fin;
a teardrop-shaped fin that promotes a reduction in friction losses; and
a micro-pillar.

4. The system of claim 3 wherein said coolant further comprises at least one of: a fully-fluorinated liquid and a two-phase refrigerant.

5. The system of claim 4 further comprising:
an inlet valve for introducing said coolant into said coolant manifold; and
an outlet valve for allowing said coolant to exit said coolant manifold wherein said coolant is circulated through said coolant manifold.

6. The system of claim 4 further comprising: a chip housing in thermal contact with said heat sink, wherein the chip housing maintains the digital micromirror device.

7. The system of claim 6 further comprising: a closed cell foam surrounding said heat sink configured to prevent condensation in said heat sink and around said heat sink and said digital micromirror device array.

8. A cooling system for a digital micromirror device, said cooling system comprising:
a digital micromirror chip comprising a digital micromirror device that includes a mirror array that directs light from a laser diode array to an imaging path and onto media at an image plane;
a coolant manifold configured to accept a heat sink in thermal communication with said digital micromirror device, wherein said heat sink is configured to fit in said coolant manifold and wherein said heat sink is spring loaded by a plurality of springs that provide for a spring load that facilitates a thermal connection to a surface of the digital micromirror device and wherein as an incident energy from said imaging laser diode array increases a temperature of said digital micromirror device, heat is conducted away from said digital micromirror device through said heat sink;
a series of bushings that isolate said spring load from a ground to prevent electrical shorting, and wherein said spring load overcomes strain forces;
a plurality of fins and at least one pillar formed in said heat sink, wherein said at least one pillar serves as a heat conducting medium between said digital micromirror device and at least one fin among said plurality of fins; and
a coolant configured to flow in an electrically insulated fluid path through said coolant manifold to said heat sink.

9. The system of claim 8 further comprising: a thermal grease configured on a heating block associated with said coolant manifold and comprising a thin thermal grease layer in a range of 5 um to 12 um thick, wherein said thermal grease is applied to an interface between said at least one pillar and said digital micromirror device to facilitate said thermal connection to said surface of said digital micromirror device, and wherein said thermal grease comprises a non-conductive thermal grease.

10. The system of claim 9 wherein:
at least one fin among said plurality of fins comprises at least one of:
a pin fin shaped in a diamond pattern fin that facilitates a series of divergent fluid paths for said coolant;
a tubular shaped cooling fin;
a teardrop-shaped fin that promote a reduction in friction losses; and
a micro-pillar.

11. The system of claim 10 wherein said coolant further comprises at least one of: a fully-fluorinated liquid and a two-phase refrigerant.

12. The system of claim 11 further comprising:
an inlet valve for introducing said coolant into said coolant manifold; and
an outlet valve for allowing said coolant to exit said coolant manifold wherein said coolant is circulated through said coolant manifold.

13. The system of claim 11 further comprising: a chip housing in thermal contact with said heat sink.

14. The system of claim 13 further comprising: a closed cell foam surrounding said heat sink configured to prevent condensation in said heat sink and around said heat sink and said digital micromirror device array.

15. A method of cooling a digital micromirror device, said method comprising:
providing a digital micromirror device comprising a digital micromirror device mirror array;
forming a heat sink in a coolant manifold that is configured to accept said heat sink;
placing a heat sink in thermal communication with said digital micromirror device, wherein said heat sink is spring loaded by a plurality of springs that provide for a spring load that facilitates a thermal connection to a surface of the digital micromirror device, wherein as an incident energy from an imaging laser diode array increases a temperature of said digital micromirror device, heat is conducted away from said digital micromirror device through said heat sink;
isolating said spring load from a ground with a series of bushings to prevent electrical shorting, wherein said spring load overcomes strain forces;
distributing a plurality of fins and at least one pillar among a plurality of pillars in said heat sink, wherein said at least one pillar serves as a heat conducting medium between said digital micromirror device and at least one fin among said plurality of fins; and
circulating a coolant through said coolant manifold to said heat sink.

16. The method of claim 15 further comprising: applying a thermal grease comprising a thin thermal grease layer in a range of 5 um to 12 um thick on a heating block associated with said coolant manifold, wherein said thermal grease is applied to an interface between said at least one pillar and said digital micromirror device to facilitate said thermal connection to said surface of said digital micromirror device, and wherein said thermal grease comprises a non-conductive thermal grease.

17. The method of claim 16 wherein:
at least one least one fin among said plurality of fins comprises at least one of:
a pin fin shaped in a diamond pattern that facilitates a series of divergent fluid paths for said coolant;
a tubular shaped cooling fin;
a teardrop-shaped fin that promotes a reduction in friction losses; and
a micro-pillar.

18. The method of claim 17 wherein said coolant further comprises at least one of: a fully-fluorinated liquid and a two-phase refrigerant.

19. The method of claim 18 further comprising: configuring a chip housing in thermal contact with said heat sink, wherein the chip housing maintains the digital micromirror device.

20. The method of claim 19 further comprising: surrounding said heat sink with a closed cell foam configured to prevent condensation in said heat sink and around said heat sink and said digital micromirror device array.

* * * * *